United States Patent [19]
Jeng et al.

[11] Patent Number: 5,814,558
[45] Date of Patent: Sep. 29, 1998

[54] INTERCONNECT CAPACITANCE BETWEEN METAL LEADS

[75] Inventors: Shin-puu Jeng, Plano; Robert H. Havemann, Garland, both of Tex.

[73] Assignee: Texas Instruments Incorporated, Dallas, Tex.

[21] Appl. No.: 658,401

[22] Filed: Jun. 4, 1996

Related U.S. Application Data

[63] Continuation of Ser. No. 298,807, Aug. 31, 1994, abandoned.

[51] Int. Cl.⁶ .................................................. H01L 21/441
[52] U.S. Cl. ............................ 438/623; 438/624; 438/669
[58] Field of Search ........................... 437/195, 228 PL, 437/927, 235, 238; 438/623, 624, 626, 631, 669

[56] References Cited

U.S. PATENT DOCUMENTS

| | | | |
|---|---|---|---|
| 4,983,546 | 1/1991 | Hyun et al. . | |
| 4,986,878 | 1/1991 | Malazgirt et al. . | |
| 5,155,576 | 10/1992 | Mizushima . | |
| 5,231,043 | 7/1993 | Chan et al. . | |
| 5,233,224 | 8/1993 | Ikeda et al. | 257/773 |
| 5,302,233 | 4/1994 | Kim et al. . | |
| 5,310,700 | 5/1994 | Lien et al. | 437/195 |
| 5,366,850 | 11/1994 | Chen et al. | 430/314 |
| 5,376,591 | 12/1994 | Maeda et al. | 437/238 |
| 5,391,921 | 2/1995 | Kudoh et al. | 257/758 |
| 5,403,780 | 4/1995 | Jain et al. | 437/195 |
| 5,407,860 | 4/1995 | Stoltz et al. | 437/180 |
| 5,413,962 | 5/1995 | Lur et al. | 437/195 |
| 5,438,022 | 8/1995 | Allman et al. | 437/231 |
| 5,461,003 | 10/1995 | Havemann et al. | 437/187 |
| 5,476,817 | 12/1995 | Numata . | |
| 5,512,775 | 4/1996 | Cho | 257/522 |

FOREIGN PATENT DOCUMENTS

| | | | |
|---|---|---|---|
| 0 411 795 A1 | 2/1991 | European Pat. Off. | 21/316 |
| 0 476 625 A2 | 3/1992 | European Pat. Off. | 23/522 |
| 0 476 625 A3 | 3/1992 | European Pat. Off. | 23/522 |
| 0 660 409 A1 | 6/1995 | European Pat. Off. | 23/532 |
| 0 411 795 B1 | 9/1995 | European Pat. Off. | 21/316 |
| 5-267290 | 10/1993 | Japan | 257/773 |

OTHER PUBLICATIONS

V. Grewal, et al. "A Novel Multilevel Metallization Technique for Advanced CMOS and Bipolar Integrated Circuits", V–MIC Conf. Jun. 9–10, 1986 pp. 107–113.

Joel R. Wiesner, "Gap Filling of Multilevel Metal Interconnects with 0.25–um Geometries", Oct. 1993, Solid State Technology, pp. 63–64.

Gretchen M. Adema, et al. "Passivation Schemes for Copper/Polymer Thin Film Interconnections Used in Multichip Modules", 1992 IEEE, pp. 776–782. (No Month).

Shin–Puu Jeng, et al. "A Planarized Multilevel Interconnect Scheme With Embedded Low–Dielectric–Constant Polymers for Sub–Quarter–Micron Applications", 1994 Symposium on VLSI Technology Digest of Technical Papers, pp. 73–74. (No Month).

*Primary Examiner*—Caridad Everhart
*Attorney, Agent, or Firm*—Kay Houston; W. James Brady, III; Richard L. Donaldson

[57] ABSTRACT

A semiconductor device and method for manufacturing same, having a low-dielectric constant material between metal leads in order to decrease unwanted capacitance. A metal layer 114 is deposited on a substrate 112. Metal leads 116 are formed in the metal layer 114. An oxide liner 118 is deposited on the metal leads 116, where the oxide liner 118 has a greater thickness on the tops of the metal leads 116 than on the sides of metal leads. A low-dielectric constant material 120 is deposited over the oxide liner 118 between the metal leads 116, where the low-dielectric constant material 120 is a material with a dielectric constant of less than 3.5.

24 Claims, 6 Drawing Sheets

INTERCONNECT CAPACITANCE BETWEEN METAL LEADS

This application is a Continuation of application Ser. No. 08/298,807, filed Aug. 31, 1994 now abandoned.

CROSS-REFERENCE TO RELATED APPLICATIONS

The following U.S. patent applications are commonly assigned and are hereby incorporated herein by reference:

| TI Case | Ser. No. | Filing Date | Inventor | Title |
|---|---|---|---|---|
| TI-18509 | 08/137,658 | 10/15/93 | Jeng | Planarized Structure for Line-to-Line Capacitance Reduction |
| TI-18867 | 08/201,679 | 2/25/94 | Jeng et al | Selective Filling Narrow Gaps with Low-dielectric-constant materials |
| TI-18929 | 08/202,057 | 2/25/94 | Jeng | Planarized Multilevel Interconnect Scheme with Embedded Low-Dielectric-Constant Insulators |
| TI-19068 | 08/234,443 | 4/28/94 | Cho | Low Dielectric Constant Insulation in VLSI applications |
| TI-19071 | 08/234,099 | 4/27/94 | Havemann | Via Formation in Polymeric Materials |
| TI-18941 | 08/247,195 | 5/20/94 | Gnade et al | A Low dielectric Constant Material for Electronics Applications |
| TI-19072 | 08/246,432 | 5/20/94 | Havemann et al | Interconnect Structure with an Integrated Low Density Dieletric |
| TI-19073 | 08/250,192 | 5/27/94 | Tigelaar et al | Suppression of Interlead Leakage when using Airgap dielectric |
| TI-19253 | 08/250,142 | 5/27/94 | Havemann | Two-step Metal Etch Process for Selective Gap Fill of Submicron Interconnects and Structure for Same |
| TI-19390 | 08/255,198 | 6/7/94 | Havemann et al | Dual Masking for Selective Gap Fill of Submicron Interconnects |
| TI-18929 | 08/202,057 | 2/25/94 | Jeng | Planarized Multilevel Interconnect Scheme with Embedded Low-Dielectric-Constant Insulators |
| TI-19109 | 08/242,922 | 5/16/94 | Jeng | A Low-temperature Anisotropic Ash Process for Resist |

FIELD OF THE INVENTION

This invention relates generally to the fabrication of semiconductor devices, and more specifically to semiconductors having low-dielectric constant materials between leads.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections.

Semiconductor devices are being scaled down in the horizontal dimension to reduce wafer costs by obtaining more chips per wafer or by increasing circuit complexity by obtaining more transistors per chip. Although semiconductor devices are being scaled down in the horizontal dimension, metal interconnects to semiconductor devices are not generally being scaled down in the vertical dimension (because the current density would exceed reliability limits). As follows with horizontal scaling, these tall metal leads are being packed closer and closer together, increasing the aspect ratio (defined as the ratio of conductor height to conductor width) to greater than one and causing capacitive coupling between the leads to become the primary limitation to circuit speed. If line-to-line capacitance is high, both circuit functionality and speed may be compromised. Reducing the capacitance within these multilevel metallization systems will reduce the RC time constant between the lines.

Typically, the material used to isolate metal leads from each other has been silicon dioxide; however, the dielectric constant of silicon dioxide deposited by chemical vapor deposition is on the order of 4.1 to 4.2. The dielectric constant is based on a scale where 1.0 represents the dielectric constant of a vacuum. Various materials exhibit dielectric constants from very near 1.0 to values in the hundreds.

SUMMARY OF THE INVENTION

Recently, attempts have been made to use low-dielectric constant materials to replace silicon dioxide as a dielectric material. The use of low-dielectric constant materials as insulating layers reduces the capacitance between metal leads, thus reducing the RC time constant. It has been found that using materials with dielectric constants of less than about 3.5 sufficiently reduces the RC time constant in typical submicron circuits. As used herein, the term low-dielectric constant will refer to a material with a dielectric constant of less than about 3.5.

One problem recognized herein is the difficulty of applying low-dielectric constant materials between metal leads along the entire height of the metal lead. It is desirable to have low-dielectric constant material extend the entire height of the metal leads to fully achieve the benefit of the low-dielectric constant material. However, depositing low-dielectric constant materials may involve an etchback step during which the low-dielectric constant material is removed from the tops of the leads. In some cases, portions of low-dielectric constant material are also removed from the sides of the leads as well. The present invention solves this problem by providing an oxide liner on top of the metal leads in order to increase the height of the low-dielectric constant material between the metal leads.

One embodiment of the present invention is a method for insulating metal leads on a semiconductor wafer, comprising the steps of depositing a metal layer on a substrate, forming metal leads in the metal layer, and depositing an oxide liner on the metal leads, where the oxide liner has a greater thickness on the tops of metal leads than on the sides of the metal leads. A low-dielectric constant material is deposited over the oxide liner between the metal leads. The low-dielectric constant material is a material with a dielectric constant of less than 3.5.

Another embodiment of the present invention involves the steps of depositing a metal layer on a substrate, forming metal leads in the metal layer, depositing a first oxide over-layer on the metal layer, and depositing an oxide liner on the first oxide over-layer, where the oxide liner has a greater thickness over the tops of metal leads than over the sides of metal leads. A low-dielectric constant material is then deposited over the oxide liner between the metal leads, where the low-dielectric constant material is a material with a dielectric constant of less than 3.5.

A further embodiment is a semiconductor device comprising a substrate, metal leads formed on the substrate, an oxide liner formed on the metal leads, where the oxide liner has a greater thickness on the tops of the metal leads than on the sides of the metal leads, and a low-dielectric constant material over the oxide liner between the metal leads. The low-dielectric constant material provides a dielectric constant of less than 3.5 in a region between the metal leads.

An advantage of the invention includes a reduction in capacitance between the metal leads. An oxide liner, first oxide over-layer, or both, resides on the metal leads, resulting in an increased height of the low-dielectric constant material on the metal leads. This allows the low-dielectric constant material to extend beyond the top of the metal leads, providing for an increase in process margin and decreasing the fringing capacitance and the line-to-line capacitance of the metal leads.

Another advantage of the present invention is that the oxide liner is thinner on the sides of the leads than on the tops of the leads. The reduced sidewall oxide thickness allows more low-dielectric constant material to be placed between metal leads, thereby reducing the line-to-line capacitance.

Another advantage of the invention is that vias to underlying metal leads may be formed through a structurally sound and high quality dielectric material, so that traditional via formation processes can be utilized.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 110 | — | Semiconductor wafer | — |
| 112 | Silicon oxide over single-crystal silicon | Substrate | May include other metal layers or other semiconductor elements, (e.g. transistors, diodes); Compound semiconductors (e.g. GaAs, InP, Si/Ge, SiC) may be used in place of Si. |
| 114 | Trilayer of TiN/AlCu/TiN | Metal layer | Other trilayers such as TiW/AlCu/Tiw; Alloys of Al, Cu, Mo, W, Ti, Si; Polysilicon, silicides, nitrides, carbides. |
| 116 | Same as element 114 | Metal leads | Typically 2:1 (height:width) aspect ratio for 0.35 µm devices |
| 118 | CVD oxide | Oxide liner | Other suitable rigid dielectric applied thicker on tops of metal leads than on sides of metal leads. |
| 120 | Parylene or polysilsequioxane | Low-dielectric constant material | Other types of spin-on glass; other vapor deposited polymer dielectrics such as teflon and polymide; aerogel; air gap (inert gases or vacuum). |
| 122 | TEOS SiO$_2$ | First oxide over-layer | Oxide, nitride, dense glass, solid inorganic, solid organics, or other suitable rigid dielectric. |
| 124 | TEOS SiO$_2$ | Portions of first oxide over-layer | Portions of first oxide over-layer 122 that remain on metal leads 116 |
| 126 | TEOS SiO$_2$ | Second oxide over-layer | Oxide, nitride, dense glass, solid inorganic, solid organics, or other suitable rigid dielectric. |

Figure 1:
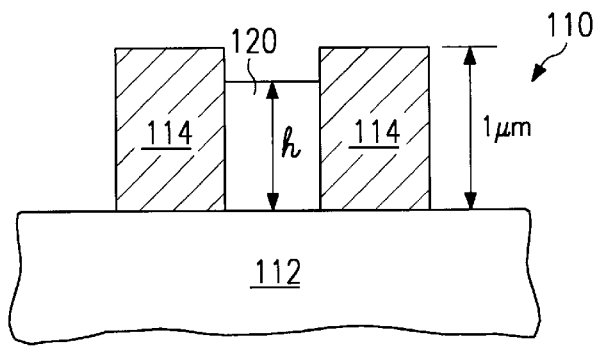
FIG. 1 is a prior art drawing showing metal leads with low-dielectric constant material between them.
Figure 2:
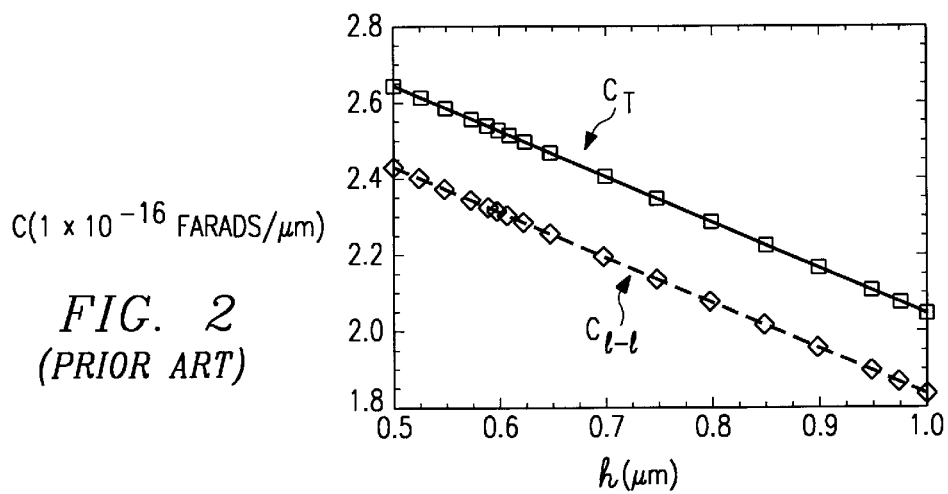
FIG. 2 is a computer simulation showing that the total lead capacitance increases as the amount of low-dielectric constant material between metal leads decreases.

In the past, when low-dielectric constant materials 120 were deposited between metal leads 114, an etchback processing step was required to minimize the amount of the low-dielectric constant material in the via region and allow standard via processing. This etchback resulted in the height of the low-dielectric constant materials h being less than the height of the metal leads, as shown in FIG. 1 (prior art). FIG. 2, also prior art, is a computer simulation showing the relationship between the height of the low-dielectric constant material 120 resident between metal leads 114 and the effect of the low-dielectric constant material 120 on capacitance. The analysis shown in FIG. 2 is for metal leads 114 having a width of 0.3 µm, spacing between leads of 0.3 µm, a thickness of 1.0 µm, and a material between leads with a dielectric constant of 2.0.

The total capacitance of a metal lead, $C_T$, is the line-to-ground capacitance $C_{l-g}$ added to the line-to-line capacitance $C_{l-l}$ (plus cross-over capacitance). The line-to-ground capacitance $C_{l-g}$ is relatively constant; in the computer simulation of FIG. 2 it is approximately $0.2 \times 10^{-6}$ F/µm. For closely spaced, e.g. submicron, metal leads, the line-to-line capacitance $C_{l-l}$ has a significant impact on the total capacitance. The formula for $C_{l-l}$ is;

$$\frac{C_{l-l}}{\epsilon} = 1.064 \left( \frac{T}{S} \right) \left( \frac{T+2H}{T+2H+0.5S} \right)^{0.695} + \left( \frac{w}{w+0.8S} \right)^{1.4148}$$

$$\left( \frac{T+2H}{T+2H+0.5S} \right)^{0.804} +$$

$$0.831 \left( \frac{w}{w+0.8S} \right)^{0.055} \left( \frac{2H}{2H+0.5S} \right)^{3.542}$$

where ∈=dielectric permittivity, or dielectric constant; W=width of the metal line or metal lead; T=thickness of the metal line; H=thickness of dielectric layer between metal layers; and S=clear spacing between parallel lines. The graph shown in FIG. 2 demonstrates that the higher the height of the low-dielectric constant material 120, the lower the line-to-line capacitance $C_{l-l}$, and thus the lower the total capacitance $C_T$. As FIG. 2 shows, increasing the thickness of the dielectric layer (the low-dielectric constant material) from 0.5 μm to 1.0 μm decreases the capacitance by a factor of approximately 20%. The present invention decreases line-to-line capacitance by increasing the height, or thickness, of the low-dielectric constant material between the leads.

Figure 3:
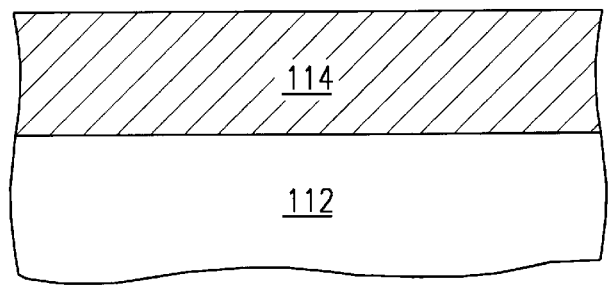
FIGS. 3–9 show cross-sections of a portion of a semiconductor device illustrating a first embodiment of the invention.
Figure 4:
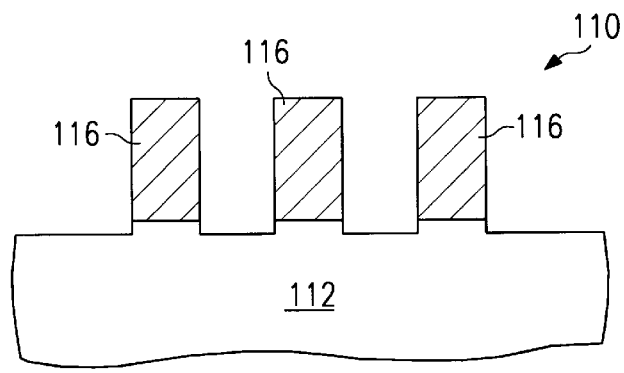
Figure 5:
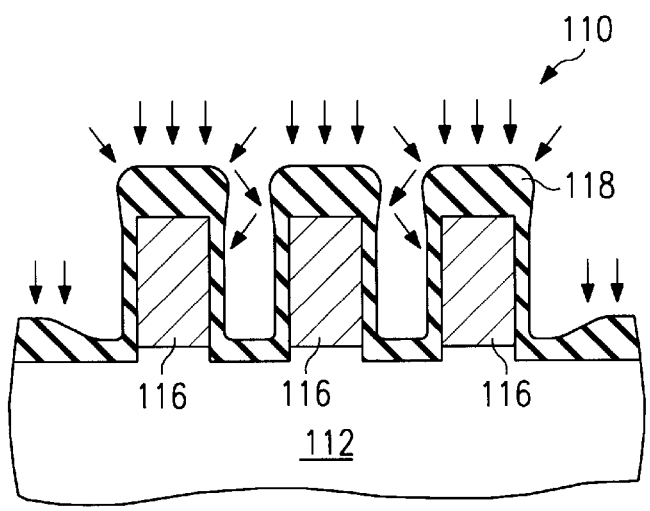
Figure 6:
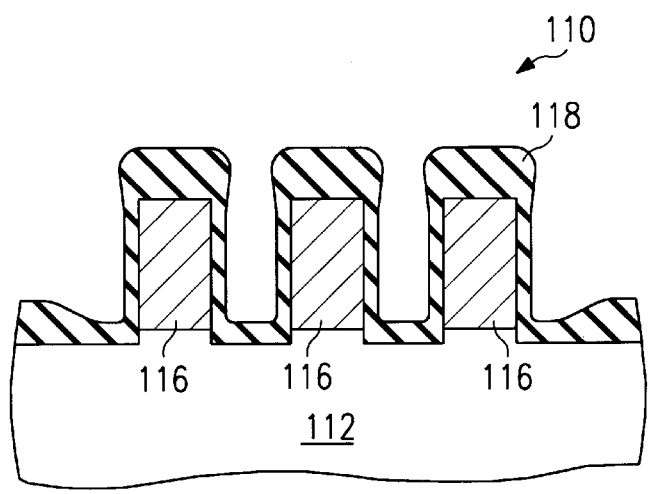
Figure 7:
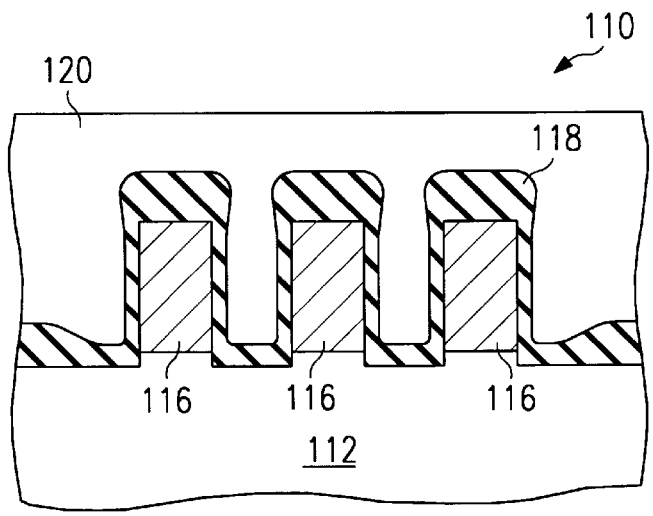
Figure 8:
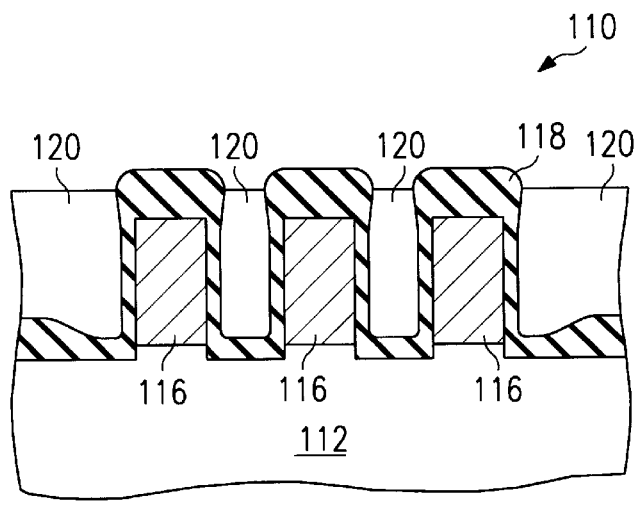
Figure 9:
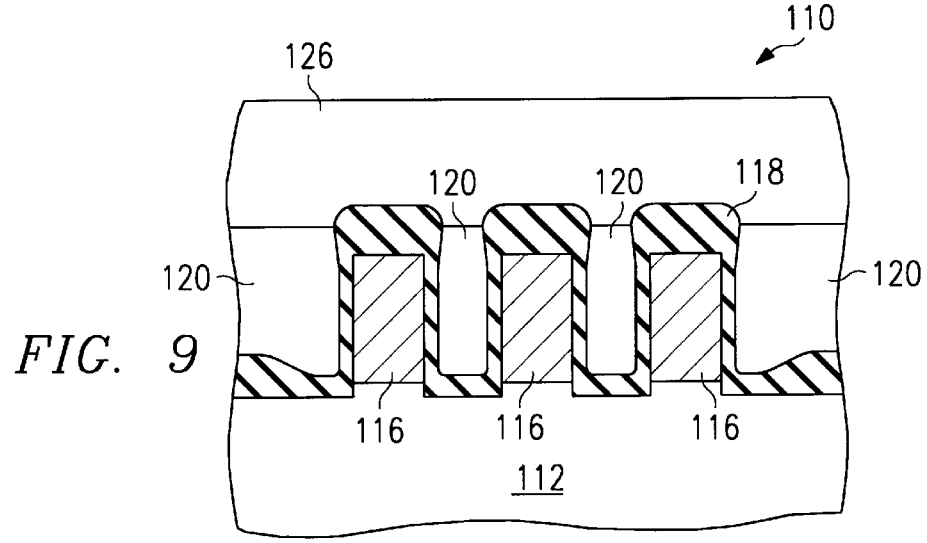

A first embodiment of the present invention is shown in FIGS. 3–9. FIG. 3 shows a semiconductor wafer 110 having a substrate 112 which may, for example, contain transistors, diodes, and other semiconductor elements (not shown) as are well known in the art. The substrate 112 may also contain metal layers. Metal layer 114 has been deposited over the substrate 112. Metal layer 114 preferably comprises a trilayer of TiN/AlCu/TiN. Generally, the TiN is sputtered on at 200° C. at a thickness of 500 angstroms. The aluminum copper alloy is preferably a mixture of 99 to 99.5% aluminum and 0.5 to 1.0% copper. The AlCu is also sputtered on at a temperature of between 100° and 200° C. at a thickness of 6000 angstroms. Then another layer of TiN is sputtered on, again at 200° C. and 500 angstroms thick. Metal layer 114 is patterned and etched (e.g. by depositing a resist, patterning and exposing the resist, and then etching the metal layer) to form metal leads 116. Typically, the aspect ratio of the metal leads is 2:1 or higher for 0.35 μm devices and beyond (devices where the spacing between leads is 0.35 μm or less). When metal leads 116 are formed, the substrate 112 is eroded slightly, e.g. by 1000 Å, as shown in FIG. 4. Next, oxide liner 118 is deposited over metal leads 116 and exposed portions of substrate 112 via a CVD oxide deposition, preferably PETEOS (plasma-enhanced tetraethoxysilane) in a nitrogen ambient. When nitrogen is added to the system during PETEOS deposition, the sidewall coverage of the metal leads 116 is reduced. The PETEOS deposition typically is performed at a susceptor (not shown) temperature of 400° to 440° C. The oxide liner 118 is thicker on the tops of metal leads 116 than on the sides of the metal leads. The plasma decomposes TEOS into $SiO_2$ precursors, and the nitrogen reduces the mobility of CVD $SiO_2$ precursors. During the PETEOS deposition with added nitrogen, when $SiO_2$ molecules hit the surface of the tops of the metal leads, they tend to remain there, rather than move down along the sidewall. Since there is less movement of $SiO_2$ along the sidewalls of the metal leads, there are less $SiO_2$ molecules that reach the spaces between the leads, as shown in FIG. 5. The resulting structure is shown in FIG. 6, with the oxide liner 118 having a bread-loaf shape. The oxide liner 118 is thicker on the tops of metal leads 116 than on the sides. The thickness of the oxide liner 118 on the tops of metal leads 116 is typically thicker than the oxide on the sides of the metal leads by 2 to 5 times (2–5×). Next, low-dielectric constant material 120 is deposited over the oxide liner 118, as shown in FIG. 7. In this embodiment, spin-on glass, e.g. polysilsequioxane, is preferably used for the low-dielectric constant material 120 and is cured, e.g. 400° C. for 1 hour, typically in a nitrogen ambient. Low-dielectric constant material 120 is etched back, e.g. with a timed etch using a standard oxide etch mixture at 100° to 200° C., as shown in FIG. 8. The low-dielectric constant material 120 remains between metal leads 116 along the entire height of the metal leads 116 or greater. Finally, subsequent processing steps are performed; for example, the deposition of a second oxide over-layer 126, e.g. TEOS $SiO_2$, as shown in FIG. 9.

Figure 10:
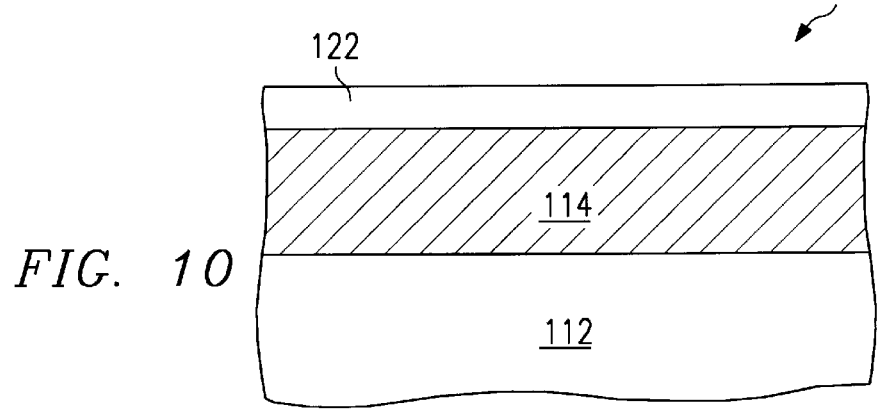
FIGS. 10–15 show cross-sections of a portion of a semiconductor device illustrating a second embodiment of the invention.
Figure 11:
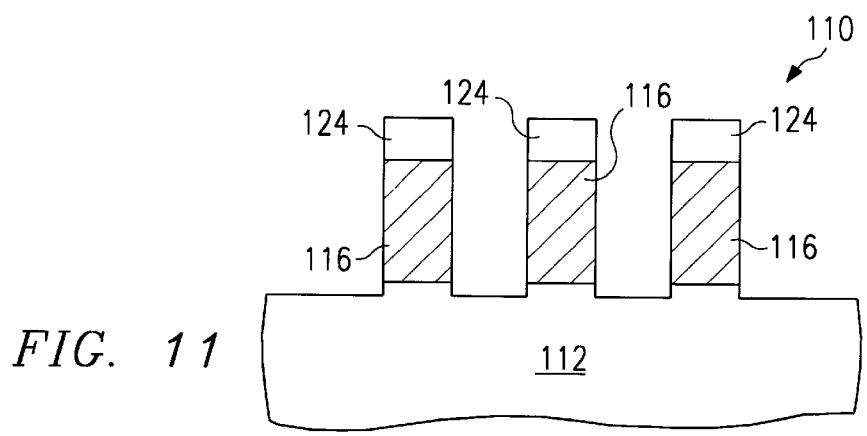
Figure 12:
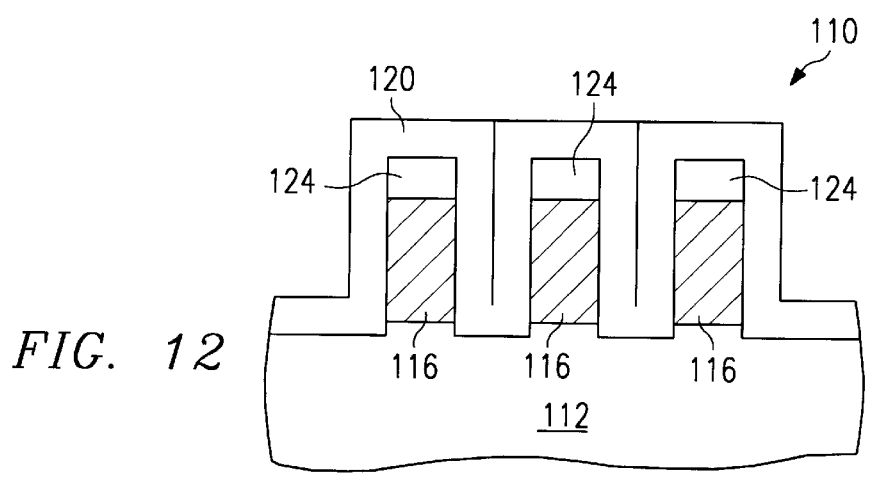
Figure 13:
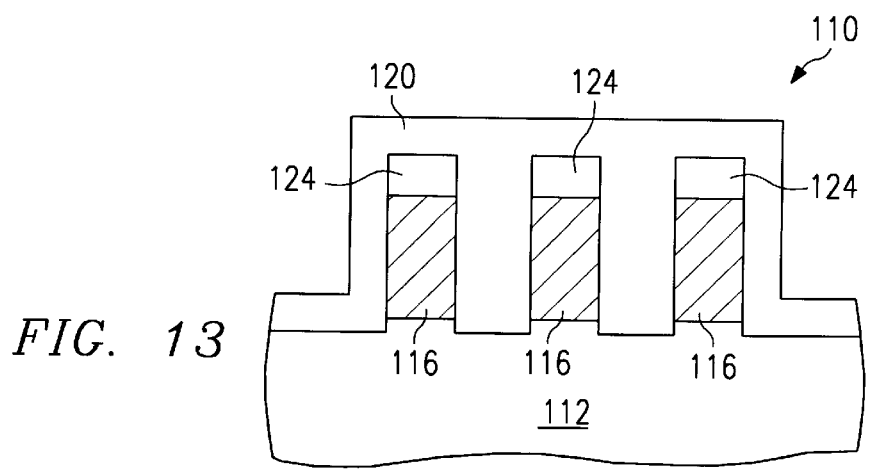
Figure 14:
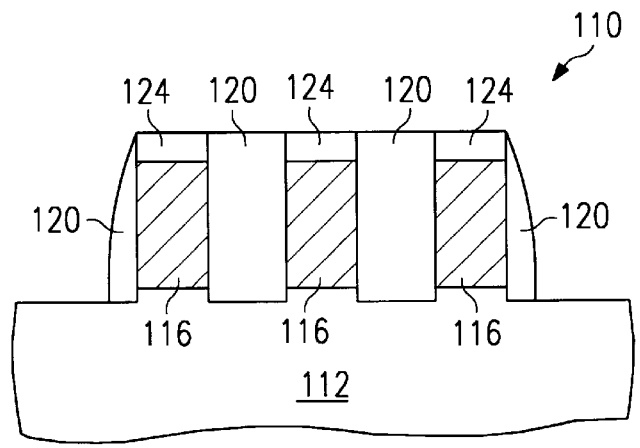
Figure 15:
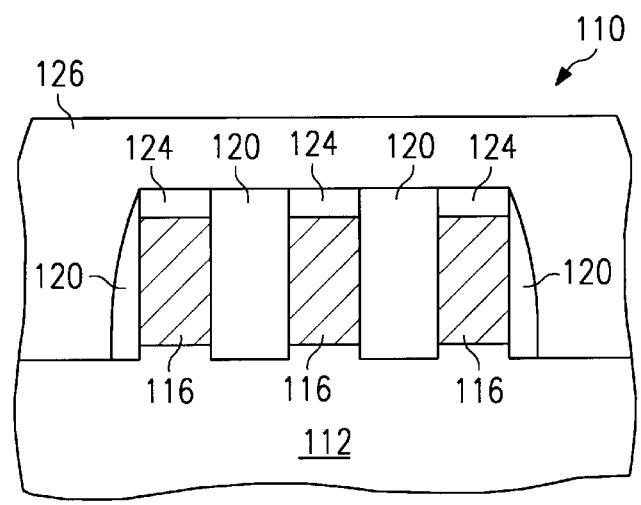

A second embodiment of the present invention is shown in FIGS. 10–15. FIG. 10 shows a semiconductor wafer 110 that has a substrate 112 and a metal layer 114 deposited over substrate 112. A first oxide over-layer 122 is deposited over metal layer 114, as shown in FIG. 10. Next, both the first oxide over-layer 122 and the metal layer 114 are patterned and etched to form metal leads 116, with portions 124 of first oxide over-layer remaining on top of the metal leads 116. The substrate 112 is etched slightly as shown in FIG. 11. Next, low-dielectric constant material 120 is deposited over the portions 124 of first oxide over-layer, the sides of metal leads 116, and the exposed portions of the substrate 112, as shown in FIG. 12. In this embodiment, the low-dielectric constant material 120 is comprised of parylene which is highly conformal. When applied, at e.g. −70° C. to room temperature, the parylene is distributed evenly over the surface of the wafer as shown in FIG. 12. The parylene forms a homogeneous layer as shown in FIG. 13. Next, the parylene is etched with an end point detection etch, e.g. an anisotropic oxygen plasma etch (see U.S. patent application Ser. No. 08/242,922 for "A Low-temperature Anisotropic Ash Process for Resist," filed May 16, 1994 by Jeng), stopping when portions 124 of the first oxide over-layer are exposed, as shown in FIG. 14. The low-dielectric constant material 120 remains between the top of the metal leads 116 and the top of the portions 124 of the first oxide over-layer. The portions 124 of the first oxide over-layer thus provide a margin for overetch of the low-dielectric constant material. Finally, subsequent processing steps may be performed, such as the deposition of a second oxide over-layer 126, as shown in FIG. 15.

Figure 16:
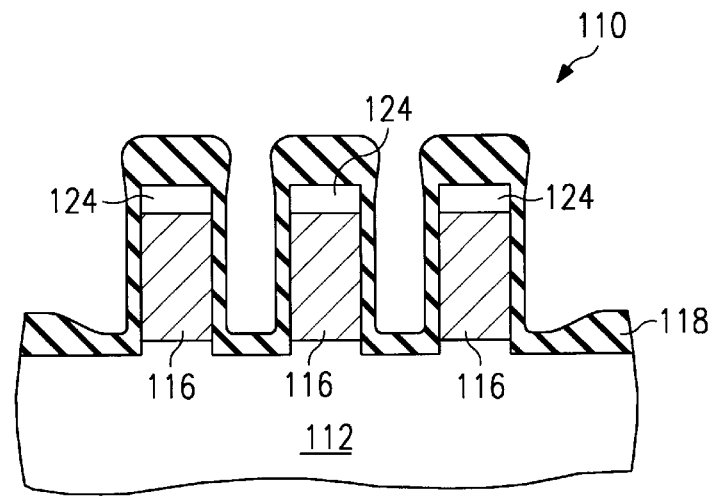
FIGS. 16–19 show cross-sections of a portion of a semiconductor device illustrating a third embodiment of the invention.
Figure 17:
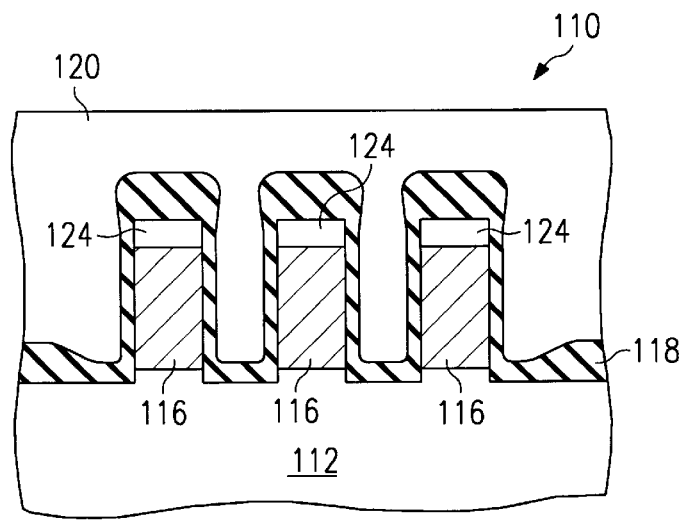
Figure 18:
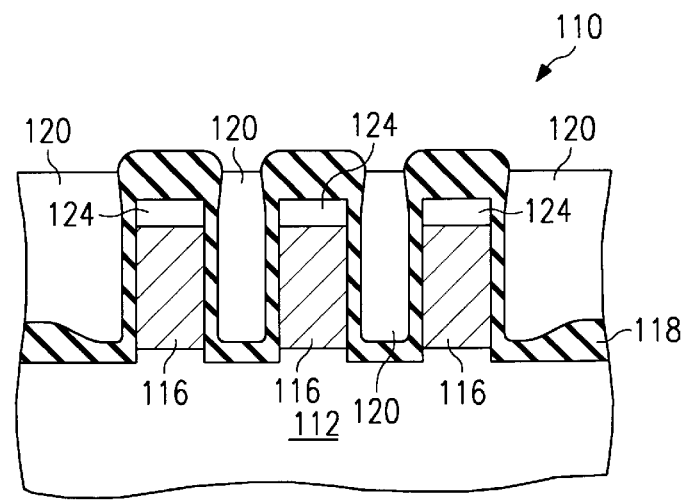
Figure 19:
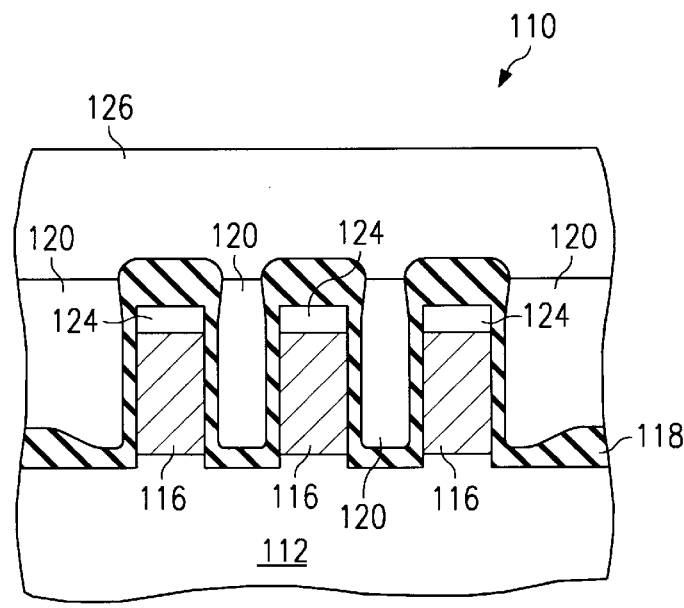

A third embodiment of the present invention is shown in FIGS. 16 to 19. Beginning with the structure shown in FIG. 11, an oxide liner 118 is deposited over portions 124 of first oxide over-layer, sides of metal leads 116, and exposed portions of the substrate 112, as shown in FIG. 16. Next, low-dielectric constant material 120 is deposited over oxide liner 118, as shown in FIG. 17. Then the low-dielectric constant material 120, preferably organic spin-on glass, is etched back, for example, with a timed etch to a height below the top of the oxide liner 118 as shown in FIG. 18. This structure provides the highest process margin since there is a double layer of oxide on top of metal leads 116: portions 124 of first oxide over-layer and oxide liner 118. Again, subsequent processing steps may be performed, for example, the deposition of a second oxide over-layer 126, as shown in FIG. 19.

Alternates for processes and element materials are appropriate and will be obvious to those skilled in the art. Table 1 indicates various preferred materials and alternates. The materials discussed for each embodiment are interchangeable: e.g. parylene may be used for the low-dielectric constant material in the first and third embodiments, and conversely, organic spin-on glass may be used as the low-dielectric constant material in the second embodiment. Also, the deposition method described in the first embodiment may be used to form an air gap, in which the low-dielectric constant material would be an inert gas or vacuum, and no etchback of the low-dielectric constant material would be required. Depositing thinner oxide on the sides of the metal leads than on the tops of the metal leads, as described in the present invention, is also beneficial when no etchback step is performed.

The novel method of improving interconnect capacitance of metal leads of semiconductor devices disclosed herein offers definite advantages over the conventional processes. In all embodiments, the oxide layer (oxide liner 118 in the first embodiment; portions 124 of first oxide over-layer in the second embodiment; and both the portions 124 of first oxide over-layer and oxide liner 118 in the third embodiment) allows for increased process margin during etchback of the low-dielectric constant material. This allows the formation of a thicker layer of low-dielectric constant material 120 between the metal leads 116, and thus reduces both fringing and line-to-line capacitance. The thinner portions of oxide layer on the sides of the metal leads 116 also prevent hillock formation on the sides of the metal leads 116.

Another advantage of the present invention is that the oxide liner 118 is thinner on the sides of the leads than on the tops of the leads. The reduced sidewall oxide thickness allows more low-dielectric constant material 120 to be placed between metal leads 116, thereby reducing the line-to-line capacitance.

Another advantage of the invention is that vias to underlying metal leads may be formed through a structurally sound and high quality dielectric material (e.g. second oxide over-layer 126), so that traditional via formation processes can be utilized.

While the invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for insulating metal leads on a semiconductor wafer, comprising the steps of:
    depositing a metal layer on a substrate;
    forming at least two metal leads in said metal layer, each metal lead having a top and at least two sides;
    depositing an oxide liner on said metal leads and on exposed portions of said substrate, said oxide liner having a greater thickness on said tops of metal leads than on said sides of metal leads, wherein said oxide liner thickness on said tops of said leads is at least twice as thick as said oxide liner thickness on said sides of said metal leads;
    depositing a low-dielectric constant material over said oxide liner at least between said metal leads, said low-dielectric constant material being a material with a dielectric constant of less than 3.5;
    etching said low-dielectric constant material to expose said oxide liner on at least said tops of metal leads; and
    depositing a second oxide over-layer over said low-dielectric constant material and said exposed oxide liner.

2. The method of claim 1 wherein said oxide liner is formed by chemical vapor deposition of plasma-enhanced TEOS in a nitrogen ambient.

3. The method of claim 1 wherein said oxide liner thickness on said tops of said leads is at least five times as thick as said oxide liner thickness on said sides of said leads.

4. A method for insulating metal leads on a semiconductor wafer, comprising the steps of:
    depositing a metal layer on a substrate;
    forming at least two metal leads in said metal layer, each metal lead having a top and at least two sides;
    depositing an oxide liner on said metal leads and on exposed portions of said substrate, said oxide liner having a greater thickness on said tops of metal leads than on said sides of metal leads;
    depositing a low-dielectric constant material over said oxide liner at least between said metal leads, said low dielectric constant material being a material with a dielectric constant of less than 3.5;
    etching said low-dielectric constant material to expose said oxide liner on at least said tops of metal leads; and
    depositing a second oxide over-layer over said low-dielectric constant material and said exposed oxide liner, wherein said low-dielectric constant material has a height at least equal to the height of said metal leads.

5. The method of claim 4 wherein said low-dielectric constant material has a height equal to at least the height of said metal leads plus at least 50% of said thickness of said oxide liner on said tops of said metal leads.

6. The method of claim 1 further comprising the step of depositing a first oxide over-layer on said metal layer, after said step of depositing a metal layer on a substrate, wherein said oxide liner is deposited over said first oxide over-layer.

7. A method for insulating metal leads on a semiconductor wafer, comprising the steps of:
    depositing a metal layer on a substrate;
    forming at least two metal leads in said metal layer, each metal lead having a top and at least two sides;
    depositing an oxide liner on said metal leads and on exposed portions of said substrate, said oxide liner having a greater thickness on said tops of metal leads than on said sides of metal leads;
    depositing a low-dielectric constant material over said oxide liner at least between said metal leads, said low-dielectric constant material being a material with a dielectric constant of less than 3.5;
    etching said low-dielectric constant material to expose said oxide liner on at least said tops of metal leads; and
    depositing a second oxide over-layer over said low-dielectric constant material and said exposed oxide liner, wherein said metal leads have an aspect ratio of at least 2:1.

8. A method for insulating metal leads on a semiconductor wafer, comprising the steps of:
    depositing a metal layer on a substrate;
    forming at least two metal leads in said metal layer, each metal lead having a top and at least two sides, leaving exposed, portions of said substrate between said metal leads;
    depositing a first oxide over-layer on said metal layer;
    depositing an oxide liner on said first oxide over-layer and said exposed portions of said substrate, said oxide liner having a greater thickness over said tops of metal leads than over said sides of metal leads, wherein said oxide liner thickness on said tops of said leads is at least twice as thick as said oxide liner thickness on said sides of said metal leads; and depositing a low-dielectric constant material over said oxide liner at least between said metal leads, said low-dielectric constant material being a material with a dielectric constant of less than 3.5;

etching said low-dielectric constant material to expose said oxide liner on at least said tops of metal leads; and depositing a second oxide over-layer over said low-dielectric constant material and said exposed oxide liner.

9. The method of claim 8 wherein said oxide liner is formed by chemical vapor deposition of plasma-enhanced TEOS in a nitrogen ambient.

10. The method of claim 8 wherein said low-dielectric constant material has a height at least equal to the height of said metal leads.

11. The method of claim 8 wherein said low-dielectric constant material has a height equal to at least the height of said metal leads plus at least 50% of said thickness of said oxide liner on said tops of said metal leads.

12. The method of claim 1 wherein said low-dielectric constant material comprises an air gap.

13. The method of claim 8 wherein said low-dielectric constant material comprises an air gap.

14. A method for insulating metal leads on a semiconductor wafer, comprising the steps of:

depositing a metal layer on a substrate;

forming at least two metal leads in said metal layer, each metal leads having a top and at least two sides;

depositing a first oxide liner on said metal leads and on exposed portions of said substrate, said first oxide liner having a greater thickness on said tops of metal leads than on said sides of metal leads, wherein said first oxide liner thickness on said tops of said leads is at least twice as thick as said first oxide liner thickness on said sides of said metal leads; and depositing a second oxide liner over at least said tops of said metal leads to leave air gaps between said metal leads, said air gaps providing a dielectric constant of less than 3.5, wherein said air gaps reside between said first oxide liner and said second oxide liner.

15. The method of claim 14 wherein said first oxide liner is formed by chemical vapor deposition of plasma-enhanced TEOS in a nitrogen ambient.

16. The method of claim 14 wherein said first oxide liner thickness on said tops of said leads is at least five times as thick as said first oxide liner thickness on said sides of said leads.

17. The method of claim 14 wherein said air gaps have a height at least equal to the height of said metal leads.

18. The method of claim 14 wherein said air gaps have a height equal to at least the height of said metal leads plus at least 50% of said thickness of said first oxide liner on said tops of said metal leads.

19. The method of claim 14 further comprising the step of depositing a first oxide over-layer on said metal layer, after said step of depositing a metal layer on a substrate, wherein said first oxide liner is deposited over said first oxide over-layer.

20. The method of claim 14 wherein said metal leads have an aspect ratio of at least 2:1.

21. A method for insulating metal leads on a semiconductor wafer, comprising the steps of:

depositing a metal layer on a substrate;

forming at least two metal leads in said metal layer, each metal lead having a top and at least two sides, leaving exposed portions of said substrate between said metal leads;

depositing a first oxide over-layer on said metal layer;

depositing a first oxide liner on said first oxide over-layer and on said exposed portions of said substrate, said first oxide liner having a greater thickness over said tops of metal leads than over said sides of metal leads, wherein said first oxide liner thickness on said tops of said leads is at least twice as thick as said first oxide liner thickness on said sides of said metal leads; and depositing a second oxide liner over at least said tops of said metal leads to leave air gaps between said metal leads, said air gaps providing a dielectric constant of less than 3.5, wherein said air gaps reside between said first oxide liner and said second oxide liner.

22. The method of claim 21 wherein said first oxide liner is formed by chemical vapor deposition of plasma-enhanced TEOS in a nitrogen ambient.

23. The method of claim 21 wherein said air gaps have a height at least equal to the height of said metal leads.

24. The method of claim 21 wherein said air gaps have a height equal to at least the height of said metal leads plus at least 50% of said thickness of said first oxide liner on said tops of said metal leads.

* * * * *